(12) United States Patent
Honda

(10) Patent No.: US 10,840,665 B2
(45) Date of Patent: Nov. 17, 2020

(54) LASER MACHINING APPARATUS

(71) Applicant: FANUC CORPORATION, Yamanashi (JP)

(72) Inventor: Masahiro Honda, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 16/199,975

(22) Filed: Nov. 26, 2018

(65) Prior Publication Data

US 2019/0173253 A1    Jun. 6, 2019

(30) Foreign Application Priority Data

Dec. 5, 2017   (JP) .................................. 2017-233784

(51) Int. Cl.
*H01S 3/00* (2006.01)
*G02B 6/42* (2006.01)
(Continued)

(52) U.S. Cl.
CPC ............ *H01S 3/0014* (2013.01); *B23K 26/06* (2013.01); *G01J 1/4257* (2013.01);
(Continued)

(58) Field of Classification Search
CPC ...... H01S 3/0014; H01S 3/067; H01S 3/4012; H01S 3/2383; H01S 3/1305;
(Continued)

(56) References Cited

U.S. PATENT DOCUMENTS 5,841,096 A * 11/1998 Takahashi ............... H01S 3/102
                                                    219/121.62
9,680,289 B2 * 6/2017 Takigawa .............. H01S 5/0021
(Continued)

FOREIGN PATENT DOCUMENTS

JP          S57-050486         3/1982
JP          2007-214170        8/2007
(Continued)

OTHER PUBLICATIONS

Office Action dated Jul. 9, 2020 in DE Patent Application No. 10 2018 219 770.9.

*Primary Examiner* — Tod T Van Roy
*Assistant Examiner* — Delma R Fordé
(74) *Attorney, Agent, or Firm* — Wenderoth, Lind & Ponack, L.L.P.

(57) ABSTRACT

A laser machining apparatus has a machining head connected to a laser oscillator having a plurality of current control units, a plurality of laser diode modules, a plurality of cavities, and a beam combiner, and performs machining by outputting light from the machining head under the control of the control unit. The laser machining apparatus includes: a current monitor unit which monitors each value of current controlled by the plurality of current control units; a power monitor unit which monitors each value of intensity of light outputted by the plurality of laser diode modules, each value of intensity of light outputted by the plurality of laser cavities, and value of intensity of light outputted by the beam combiner; and a judgment unit that judges a failure location based on values of current monitored by the current monitor unit, and values of intensity of light monitored by the power monitor.

17 Claims, 6 Drawing Sheets

(51) Int. Cl.
*H01S 3/067* (2006.01)
*G01J 1/42* (2006.01)
*H01S 3/131* (2006.01)
*H01S 3/136* (2006.01)
*H01S 3/106* (2006.01)
*H01S 3/0941* (2006.01)
*H01S 5/068* (2006.01)
*B23K 26/06* (2014.01)
*H01S 5/0683* (2006.01)

(52) U.S. Cl.
CPC .......... *G02B 6/4286* (2013.01); *H01S 3/067* (2013.01); *H01S 3/0941* (2013.01); *H01S 3/106* (2013.01); *H01S 3/131* (2013.01); *H01S 3/136* (2013.01); *H01S 3/1312* (2013.01); *H01S 5/06825* (2013.01); *H01S 5/0683* (2013.01); *H01S 5/06808* (2013.01)

(58) Field of Classification Search
CPC .......... H01S 3/09408; H01S 3/094011; H01S 3/0675; H01S 3/0941; H01S 3/10007; H01S 3/106; H01S 3/1301; H01S 3/131; H01S 3/1312; H01S 3/136; G02B 6/4286; G02B 6/2804; G01J 1/44; G01J 1/4257
See application file for complete search history.

(56) References Cited

U.S. PATENT DOCUMENTS

| | | | |
|---|---|---|---|
| 9,685,758 B2* | 6/2017 | Takigawa | H01S 5/06825 |
| 2003/0234240 A1* | 12/2003 | Yamazaki | B23K 26/702 |
| | | | 219/121.62 |
| 2011/0122895 A1* | 5/2011 | Savage-Leuchs | |
| | | | H01S 3/06716 |
| | | | 372/10 |
| 2016/0308328 A1 | 10/2016 | Sakamoto | |
| 2016/0359288 A1* | 12/2016 | Matsuoka | H01S 3/2383 |
| 2017/0125976 A1 | 5/2017 | Sato | |
| 2017/0133819 A1 | 5/2017 | Takigawa et al. | |
| 2018/0138654 A1* | 5/2018 | Chiba | H01S 3/1022 |
| 2018/0214978 A1* | 8/2018 | Honda | B23K 26/21 |
| 2019/0109433 A1* | 4/2019 | Takigawa | H01S 5/022 |
| 2019/0191542 A1* | 6/2019 | Iwamoto | H05K 1/0204 |

FOREIGN PATENT DOCUMENTS

| | | |
|---|---|---|
| JP | 2009-239032 | 10/2009 |
| JP | 2012-084630 | 4/2012 |
| WO | 2015/129097 | 9/2015 |

* cited by examiner

LASER MACHINING APPARATUS

This application is based on and claims the benefit of priority from Japanese Patent Application No. 2017-233784, filed on 5 Dec. 2017, the content of which is incorporated herein by reference.

BACKGROUND OF THE INVENTION

Field of the Invention

The present invention relates to a laser machining apparatus.

Related Art

Conventionally, a laser machining apparatus equipped with a plurality of fiber lasers has been known. Such a laser machining apparatus, upon a laser diode (LD) module or laser cavity having failed, requires time in units of days to recover; therefore, backup operation become necessary until recovered. Therefore, for example, with the laser machining apparatus described in Patent Document 1, in the case of the ratio of power of the laser beam falling below a predetermined threshold, it is possible to grasp that an abnormality has occurred by determining an abnormality such as failure has occurred.

Patent Document 1: PCT International Publication No. WO2015/129097

SUMMARY OF THE INVENTION

However, the above-mentioned laser machining apparatus is not matter that specifies the location at which an abnormality occurred, and thus cannot perform backup operation until recovery in the case of abnormality occurring.

The present invention has an object of providing a laser machining apparatus which can perform backup operation upon an abnormality occurring.

A laser machining apparatus (for example, the laser machining apparatus 1 described later) according to a first aspect of the present invention, in which a machining head (for example, the machining head 5 described later) is connected to a laser oscillator (for example, the laser oscillator 4 described later) which includes: a plurality of current control units (for example, the current control unit 7 described later) connected mutually in parallel to a power supply (for example, the power supply 3 described later) and controlling current outputted from the power supply; a plurality of laser diode modules (for example, the laser diode module 8 described later) which are connected one-to-one to the plurality of current control units, and output light by the current controlled by the current control units flowing therethrough; a plurality of laser cavities (for example, the laser cavity 9 described later) which connect one-to-several to the plurality of laser diode modules, and amplify and then output light outputted by the laser diode modules; and a beam combiner (for example, the beam combiner 10 described later) which connects one-to-several to the plurality of beam cavities, and combines light outputted by the plurality of laser cavities, in which the laser machining apparatus performs machining by outputting the light combined by the beam combiner under control of a control unit from the machining head, the laser machining apparatus including: a current monitor unit (for example, the current monitor unit 11 described later) which monitors each value of current controlled by the plurality of current control units; a power monitor unit (for example, the power monitor unit 12 described later) which monitors each value of intensity of light outputted by the plurality of laser diode modules, each value of intensity of light outputted by the plurality of laser cavities, and value of intensity of light outputted by the beam combiner; and a judgment unit (for example, the judgment unit 13 described later) that judges a failure location based on values of current monitored by the current monitor unit, and values of intensity of light monitored by the power monitor.

According to a second aspect of the present invention, in the laser machining apparatus as described in the first aspect, the control unit, in a case of the judgment unit judging any of the plurality of current control units and the plurality of laser diode modules as being a failure location, may increase current outputted to the current control unit which does not include a failure location on a path, so as to set an intensity of light outputted by the machining head as the same as prior to failure.

According to a third aspect of the present invention, in the laser machining apparatus as described in the first or second aspect, the control unit, in a case of the judgment unit judging any of the plurality of laser cavities as being a failure location, may suspend current outputted to the current control unit which includes a failure location on a path, and increase current outputted to the current control unit which does not include a failure location on the path, so as to set an intensity of light outputted by the machining head as equal to prior to failure, or when not able to set as equal, make approach equal.

According to a fourth aspect of the present invention, in the laser machining apparatus as described in the third aspect, the control unit may perform backup operation with reduced machining speed, when not able to set the intensity of light outputted by the machining head as equal to prior to failure.

According to a fifth aspect of the present invention, the laser machining apparatus as described in any one of the first to fourth aspects may further include: a plurality of the laser oscillators; and a switch (for example, the switch 6 described later) which switches between the oscillator to which the machining head is connected, in which the control unit, in a case of the judgment unit judging that the beam combiner is a failure location, may control the switch to switch the laser oscillator to which the machining head is connected, and perform backup operation.

According to the present invention, it is possible to provide a laser machining apparatus which can perform backup operation upon an abnormality occurring.

DETAILED DESCRIPTION OF THE INVENTION

Figure 1:
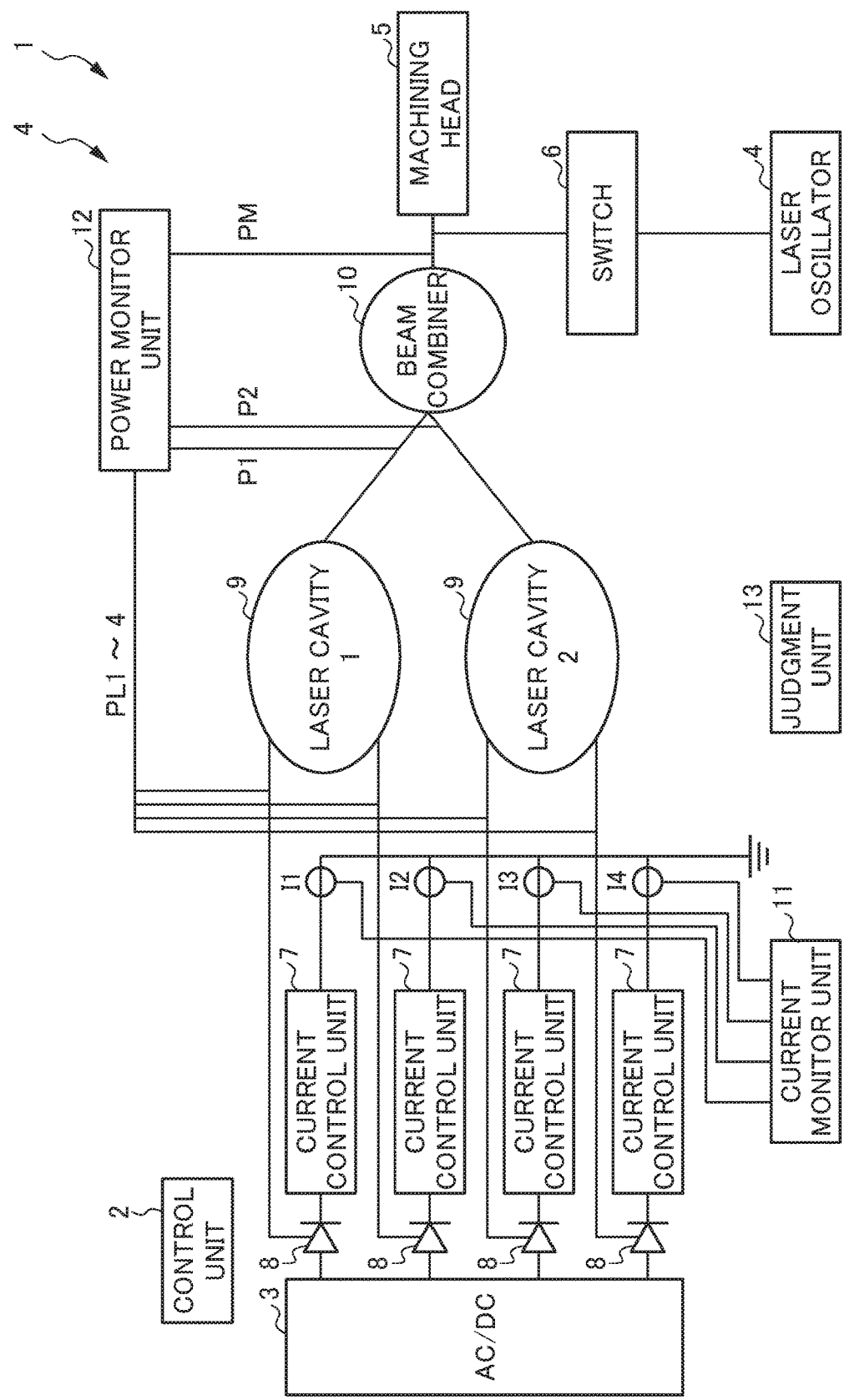
FIG. 1 is a schematic diagram showing a laser machining apparatus according to an embodiment of the present invention.
Figure 2:
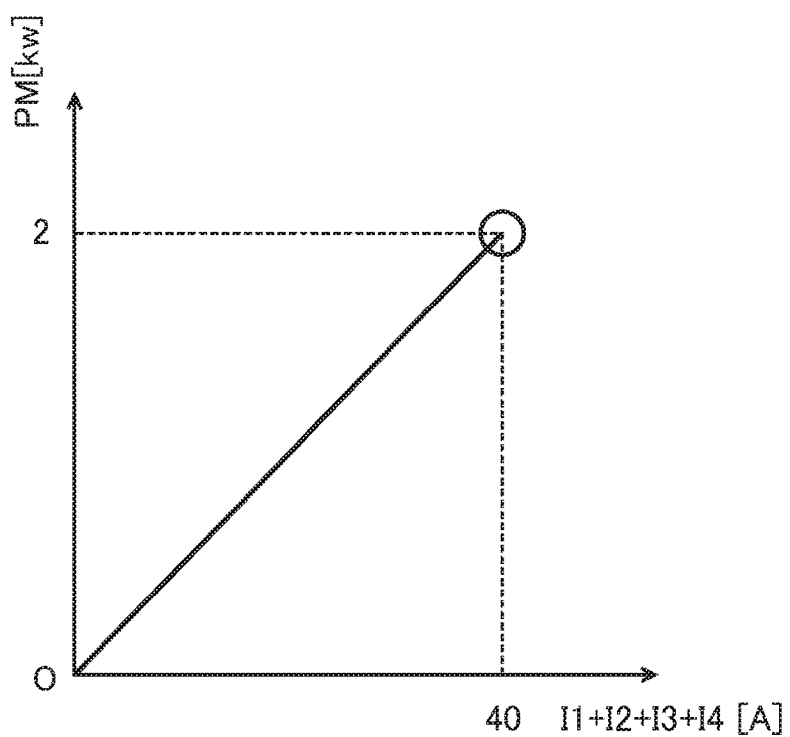
FIG. 2 is a graph of monitor results of a current monitor unit and a power monitor unit showing when normal, and shows a total of the values of current outputted from a power supply on the horizontal axis, and shows the value of intensity of light outputted by a beam combiner on the vertical axis.
Figure 3:
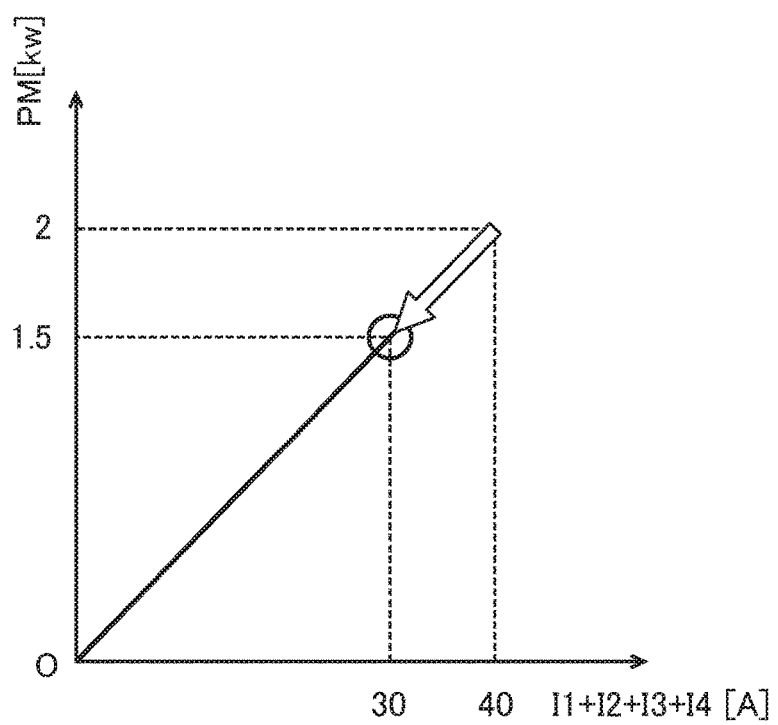
FIG. 3 is a graph of monitor results of the current monitor unit and power monitor unit showing a case of there being failure in a current control unit, and shows a total of the value of current outputted from a power supply on the horizontal axis, and shows the value of intensity of light outputted by a beam combiner on the vertical axis.
Figure 4:
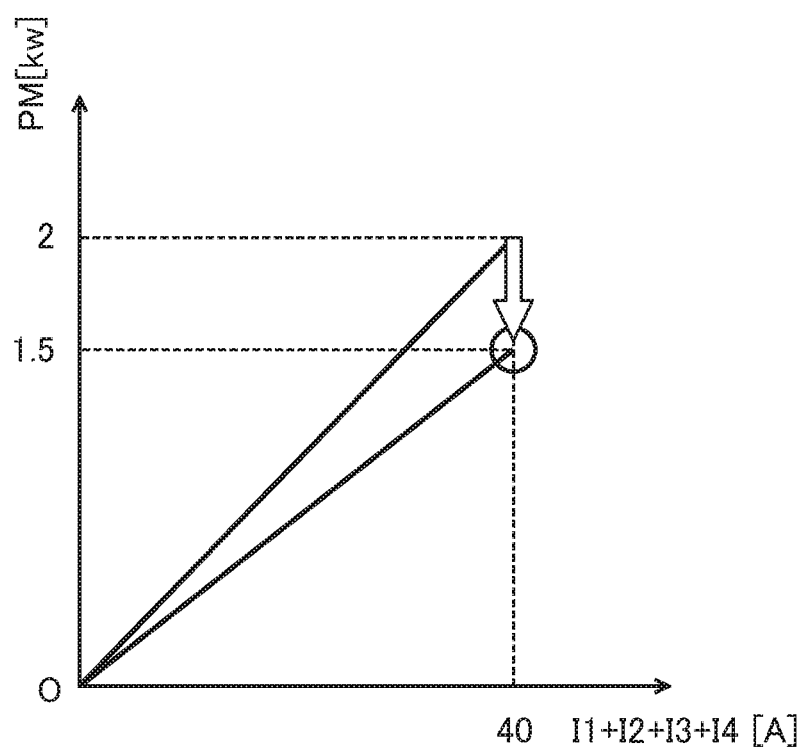
FIG. 4 is a graph of monitor results of a current monitor unit and power monitor unit, showing a case of there being a failure in the laser diode module, and shows a total of the value of current outputted from a power supply on the horizontal axis, and shows the value of intensity of light outputted by a beam combiner on the vertical axis.
Figure 5:
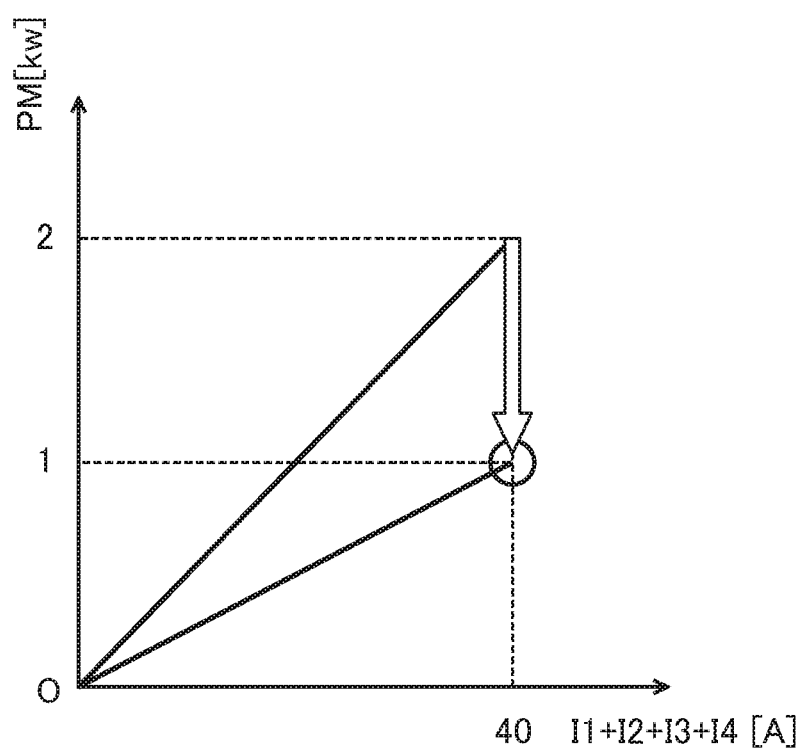
FIG. 5 is a graph of monitor results of a current monitor unit and power monitor unit, showing a case of there being a failure in the laser cavity, and shows a total of the value of current outputted from a power supply on the horizontal axis, and shows the value of intensity of light outputted by a beam combiner on the vertical axis.
Figure 6:
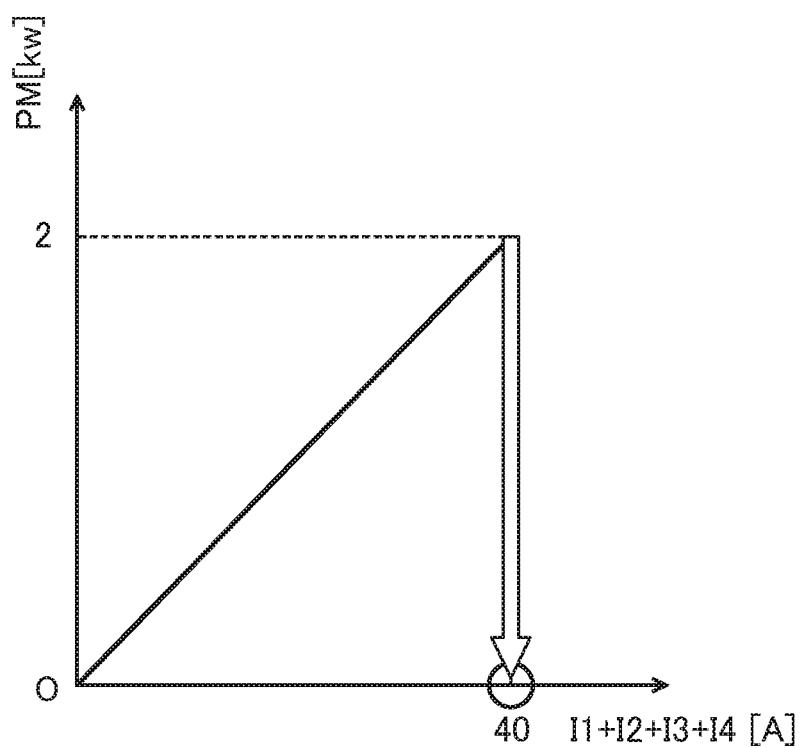
FIG. 6 is a graph of monitor results of a current monitor unit and power monitor unit, showing a case of there being a failure in the beam combiner, and shows a total of the value of current outputted from a power supply on the horizontal axis, and shows the value of intensity of light outputted by a beam combiner on the vertical axis.

Hereinafter, an embodiment of the present invention will be explained in detail while referencing the drawings. FIG. 1 is a schematic diagram showing a laser machining apparatus 1 according to an embodiment of the present invention. FIG. 2 is a graph of monitor results of a current monitor unit 11 and power monitor unit 12, showing when normal. FIG. 3 is a graph of monitor results of the current monitor unit 11 and power monitor unit 12, showing a case of there being failure in a current control unit 7. FIG. 4 is a graph of monitor results of the current monitor unit 11 and power monitor unit 12, showing a case of there being failure in a laser diode module 8. FIG. 5 is a graph of monitor results of the current monitor unit 11 and power monitor unit 12, showing a case of there being failure in a laser cavity 9. FIG. 6 is a graph of monitor results of the current monitor unit 11 and power monitor unit 12, showing a case of there being failure in a beam combiner 10. FIGS. 2, 3, 4, 5 and 6 show the total of the values of current outputted from a power supply 3 on the horizontal axis, and show the value of intensity of light outputted by the beam combiner 10 on the vertical axis.

As shown in FIG. 1, the laser machining apparatus 1 is an apparatus used by a machining head 5 being connected to a laser oscillator 4, and performs machining by outputting light from the machining head 5 under the control of a control unit (CNC) 2. More specifically, the laser machining apparatus 1 includes the control units 2, power supply 3, two laser oscillators 4, a machining head 5, and a switch 6.

The control unit 2 intergrally controls the laser machining apparatus 1. The power supply 3 supplies electric power serving as the power source of the laser machining apparatus 1.

The two laser oscillators 4 are used by the machining head 5 being connected to one, and the remaining one standing by for backup operation. The laser oscillator 4 used by the machining head 5 being connected is switched by the switch 6. More specifically, the laser oscillator 4 includes a plurality (four in the present embodiment) of current control units 7, a plurality (four in the present embodiment) of laser diode (LD) modules 8, a plurality (two in the present embodiment) of laser cavities 9, a beam combiner 10, a current monitor unit 11, a power monitor unit 12, and a judgment unit 13.

The plurality of current control units 7 is connected in parallel to each other to the power supply 3, and controls the current outputted from the power supply 3. A field effect transistor (FET) or the like is used in the current control unit 7.

The plurality of laser diode modules 8 is connected one-to-one to the plurality of current control units 7, and outputs light by the current controlled by the current control units 7 flowing therethrough.

The plurality of laser cavities 9 is connected one-to-several (one-to-two in the present embodiment) to the plurality of laser diode modules 8, and amplifies and then outputs light outputted by the laser diode modules 8.

The beam combiner 10 is connected one-to-several (one-to-two in the present embodiment) to the plurality of laser cavities 9, and combines and then outputs the light outputted by the plurality of laser cavities 9.

The current monitor unit 11 monitors each of values I1[A], I2[A], I3[A] and I4[A] of the current controlled by the plurality of current control units 7, and inputs the monitor result to the judgment unit 13.

The power monitor 12 monitors each of values PL1[kW], PL2[kW], PL3[kW] and PL4[kW] of intensity of light outputted by the plurality of laser diode modules 8, each of values P1[kW], P2[kW] of intensity of light outputted by the plurality of laser cavities 9, and inputs monitor results to the judgment unit 13.

The monitor results are inputted from the current monitor unit 11 and power monitor unit 12, and the judgement unit 13 judges the failure location based on these monitor results (values I1[A], I2[A], I3[A] and I4[A] of the current monitored by the current monitor unit 11; values PL1[kW], PL2[kW], PL3[kW], PL4[kW], P1[kW], P2[k], PM[kW] of intensity of light monitored by the power monitor unit 12).

For example, the judgment unit 13 judges as being when normal in the case of the monitor results inputted from the current monitor unit 11 being I1=I2=I3=I4=10 [A], and the monitor results inputted from the power monitor unit 12 being PL1=PL2=PL3=PL4=0.5 [kW], P1=P2=1 [kW], PM=2 [kW], and inputs this judgment result to the control unit 2.

In addition, the judgment unit 13 judges that there is a failure in the current control unit 7 indicating 0 [A] in the case of any of I1[A], I2[A], I3[A] and I4[A] being 0 [A] in the monitor results inputted from the current monitor unit 11, and that this current control unit 7 being the failure location, and inputs this judgment result to the control unit 2. should be noted that the judgment result of the judgment unit 13 in this case is not influenced by the monitor result inputted from the power monitor unit 12.

For example, the judgment unit 13 judges that there is a failure in the current control unit 7 indicating I4=0 [A] in the case of the monitor result inputted from the current monitor unit 11 being normal at I1=I2=I3=10 [A], and being abnormal at I4=0 [A], and the monitor result inputted from the power monitor unit 12 being abnormal at PL1=PL2=PL3=0.5 [kW], PL4=0 [kW], P1=1 [kW], P2=0.5 [kW], PM=1.5 [kW], and that this current control unit 7 is the failure location, and inputs this judgment result to the control unit 2 (refer to FIG. 3).

In addition, the judgment unit 13 judges that there is failure in the laser diode module 8 indicating 0 [kW] in the case of the monitor result inputted from the current monitor unit 11 being normal, while any of PL1[kW], PL2[kW], PL3[kW] and PL4[kW] in the monitor result inputted from the power monitor unit 12 is abnormal at 0 [kW], and that this laser diode module 8 is the failure location, and inputs this judgment result to the control unit 2.

For example, the judgment unit 13 judges that there is a failure in the laser diode module 8 indicating PL4=0 [kW] in the case of the monitor result inputted from the current, monitor unit 11 being I1=I2=I3=I4=10 [A] and the monitor result inputted from the power monitor unit 12 being normal at PL1=PL2=PL3=0.5 [kW], P1=1 [kW], and being abnormal at PL4=0 [kW], P2=0.5 [kW], and PM=1.5 [kW], and that this laser diode module 8 is the failure location, and inputs this judgment result, to the control unit 2 (refer to FIG. 4).

In addition, the judgment unit 13 judges that there is a failure in the laser cavity 9 indicating an abnormal value in the case of the monitor result inputted from the current monitor unit 11 being normal, while PL1[kW], PL2[kW], PL3[kW] and PL4[kW] in the monitor results inputted from the power monitor unit 12 are normal, and any of P1[kW] and P2[kW] is abnormal, and that this laser cavity 9 is a failure location, and inputs this judgment result to the control unit 2.

For example, the judgment unit 13 judges that there is a failure in the laser cavity 9 indicating P2=0 [kW] in the case of the monitor result inputted from the current monitor unit 11 being normal at I1=I2=I3=I4=10 [A], and the monitor result inputted form the power monitor unit 12 being normal at PL1=PL2=PL3=PL4=0.5 [kW] and being abnormal at P2=0 [kw] and PM=1 [kW], and that this laser cavity 9 is a failure location, and inputs this judgment result to the control unit 2 (refer to FIG. 5).

In addition, the judgment unit 13 judges that there is a failure in the beam combiner 10 indicating an abnormal value in the case of the monitor results inputted from the current monitor unit 11 being normal, and PL1[kW], PL2[kW], PL3[kW], PL4[kW], P1[kW] and P2[kW] being normal and PM[kW] being abnormal in the monitor results inputted from the power monitor unit 12, and that this beam combiner 10 is a failure location, and inputs this judgment result to the control unit 2.

For example, the judgment unit 13 judges that there is a failure in the beam combiner 10 indicating PM=0 [kW] in a case of the monitor results inputted from the current monitor unit 11 being normal at I1=I2=I3=I4=10 [A], and the monitor results inputted from the power monitor unit 12 being normal at PL1=PL2=PL3=PL4=0.5 [kW], P1=P2=1 [kW], and abnormal at PM=0 [kW], and that this beam combiner 10 is a failure location, and inputs this judgment result to the control unit 2 (refer to FIG. 6).

The control unit 2, in a case of the judgment unit 13 judging that any of the plurality of current control units 7 and plurality of laser diode modules 8 is a failure location, increases current outputted from the power supply 3 to the current control units 7 not including a failure location on the path, and sets the intensity of light outputted by the machining head 5 as equal to prior to failure.

For example, the control unit 2, in a case of the judgment unit 13 judging that the current control unit 7 indicating I4=0 [A] is a failure location, increases currents I1[A], I2[A], I3[A] outputted from the power supply 3 to the current control unit 7 not including the failure location on the path to 13.333 [A], so as to set the intensity of light outputted from the machining head 5 as equal to prior to failure. In this case, PL1=PL2=PL3=0.667 [kW].

Alternatively, the control unit 2, in the case of the judgment unit 13 judging that the laser diode module 8 indicating PL4=0 [kw] is a failure location, increases the currents I1[A], I2[A] and I3[A] outputted from the power supply 3 to the current control units 7 not including a failure location on the path to 13.333 [A] so as to set the intensity of light outputted from the machining head 5 as equal to prior to failure. In this case, PL1=PL2=PL3=0.667 [kW].

In addition, the control unit 2, in a case of the judgment unit 13 judging that any of the plurality of laser cavities 9 is a failure location, interrupts current outputted. from the power supply 3 to the current control unit 7 including the failure location on the path, increases the current outputted from the power supply 3 to the current control units 7 not including a failure location on the path, and sets the intensity of light outputted by the machining head 5 as equal to prior to failure, or when not possible to set as equal for circumstances of rated current or permitted value, makes approach equal. The control unit 2, when not able to set the intensity of light outputted by the machining head 5 as equal to prior to failure for circumstances of rated current or permitted value, performs backup operation with reduced machining speed.

For example, the control unit 2, in a case of the judgment unit 13 judging that the laser cavity 9 indicating an abnormal value P2[kW] is a failure location, interrupts current outputted for the power supply 3 to the current control unit 7 including a failure location on the path and sets I3=I4=0 [A], and increases the currents I1[A] and I2[A] outputted from the power supply 3 to the current control unit 7 not including a failure location on the path to 20 [A] so as to set the intensity of light outputted from the machining head 5 as equal to prior to failure. In this case, P1=2 [kW].

In addition, the control unit 2, in the case of the judgment unit 13 judging that the beam combiner 10 is a failure location, controls the switch 6 to switch the laser oscillator 4 to which the machining head 5 is connected and perform backup operation.

In the above way, according to the laser machining apparatus 1 according to the present embodiment, it is possible to specify the failure location according to the monitor results from the current monitor unit 11 and power monitor unit 12. In addition, since it is possible to specify the failure location, upon an abnormality arising, it is possible to perform backup operation automatically without interrupting the laser oscillator 4 depending on the failure location.

In the case of the failure location being the current control unit 7 or laser diode module 8, it is possible to perform backup operation with the remaining path that is not damaged, and maintain predetermined output. In addition, in the case of not being able to maintain the output with the failure location being the laser cavity 9, beam combiner 10 or the like, it is possible to change the machining conditions, and use the switch 6 to do backup operation with another laser oscillator 4.

Although an embodiment, of the present invention has been explained above, the present invention is not to be limited to the aforementioned embodiment. In addition, the effects described in the present embodiment are merely listing the most preferred effects produced from the present invention, and the effects according to the present invention are not to be limited to those described in the present embodiment.

EXPLANATION OF REFERENCE NUMERALS 1 laser machining apparatus
2 control unit
4 laser oscillator
5 machining head
6 switch
7 current control unit
8 laser diode module 9 laser cavity
10 beam combiner
11 current monitor unit
12 power monitor unit
13 judgment unit

What is claimed is:

1. A laser machining apparatus wherein a machining head is connected to a laser oscillator which includes: a plurality of current control units connected mutually in parallel to a power supply and controlling current outputted from the power supply;
   a plurality of laser diode modules which are connected one-to-one to the plurality of current control units, and output light by the current controlled by the current control units flowing therethrough;
   a plurality of laser cavities which connect one-to-several to the plurality of laser diode modules, and amplify and then output light outputted by the laser diode modules; and
   a beam combiner which connects one-to-several to the plurality of laser cavities, and combines light outputted by the plurality of laser cavities,
   wherein the laser machining apparatus is configured to perform machining by outputting the light combined by the beam combiner under control of a control unit from the machining head, the laser machining apparatus further comprising:
   a current monitor unit which monitors each value of current controlled by the plurality of current control units; and
   a power monitor unit which monitors each value of intensity of light outputted by the plurality of laser diode modules, each value of intensity of light outputted by the plurality of laser cavities, and value of intensity of light outputted by the beam combiner,
   wherein the laser machining apparatus is configured to judge a failure location based on values of current monitored by the current monitor unit, and values of intensity of light monitored by the power monitor unit,
   the failure location is judged to be in the plurality of current control units if any value of current controlled by the plurality of current control units is 0 A,
   the failure location is judged to be in the plurality of laser diode modules if the failure location is not judged to be in the plurality of current control units and any value of intensity of light outputted by the plurality of laser diode modules is 0 kW,
   the failure location is judged to be in the plurality of laser cavities if the failure location is not judged to be in the plurality of current control units or the plurality of laser diode modules and any value of intensity of light outputted by the plurality of laser cavities is 0 kW, and
   the failure location is judged to be at the beam combiner if the failure location is not judged to be in the plurality of current control units, the plurality of laser diode modules, or the plurality of laser cavities, and the value of intensity of light outputted by the beam combiner is 0 kW.

2. The laser machining apparatus according to claim 1, wherein the control unit, in a case of the laser machining apparatus judging any of the plurality of current control units and the plurality of laser diode modules as being a failure location, increases current outputted to the current control unit which does not include a failure location on a path, so as to set an intensity of light outputted by the machining head as the same as prior to failure.

3. The laser machining apparatus according to claim 1, wherein the control unit, in a case of the laser machining apparatus judging any of the plurality of laser cavities as being a failure location, suspends current outputted to the current control unit which includes a failure location on a path, and increases current outputted to the current control unit which does not include a failure location on the path, so as to set an intensity of light outputted by the machining head as equal to prior to failure, or when not able to set as equal, makes approach equal.

4. The laser machining apparatus according to claim 2, wherein the control unit, in a case of the laser machining apparatus judging any of the plurality of laser cavities as being a failure location, suspends current outputted to the current control unit which includes a failure location on a path, and increases current outputted to the current control unit which does not include a failure location on the path, so as to set an intensity of light outputted by the machining head as equal to prior to failure, or when not able to set as equal, makes approach equal.

5. The laser machining apparatus according to claim 3, wherein the control unit performs backup operation with reduced machining speed, when not able to set the intensity of light outputted by the machining head as equal to prior to failure.

6. The laser machining apparatus according to claim 4, wherein the control unit performs backup operation with reduced machining speed, when not able to set the intensity of light outputted by the machining head as equal to prior to failure.

7. The laser machining apparatus according to claim 1, further comprising a plurality of the laser oscillators; and
   a switch which switches between the oscillator to which the machining head is connected,
   wherein the control unit, in a case of the laser machining apparatus judging that the beam combiner is a failure location, controls the switch to switch the laser oscillator to which the machining head is connected, and performs backup operation.

8. The laser machining apparatus according to claim 2, further comprising a plurality of the laser oscillators;
   a switch which switches between the oscillator to which the machining head is connected,
   wherein the control unit, in a case of the laser machining apparatus judging that the beam combiner is a failure location, controls the switch to switch the laser oscillator to which the machining head is connected, and performs backup operation.

9. The laser machining apparatus according to claim 3, further comprising a plurality of the laser oscillators;
   a switch which switches between the oscillator to which the machining head is connected,
   wherein the control unit, in a case of the laser machining apparatus judging that the beam combiner is a failure location, controls the switch to switch the laser oscillator to which the machining head is connected, and performs backup operation.

10. The laser machining apparatus according to claim 4, further comprising a plurality of the laser oscillators;
    a switch which switches between the oscillator to which the machining head is connected,
    wherein the control unit, in a case of the laser machining apparatus judging that the beam combiner is a failure location, controls the switch to switch the laser oscillator to which the machining head is connected, and performs backup operation.

11. The laser machining apparatus according to claim 5, further comprising a plurality of the laser oscillators;
a switch which switches between the oscillator to which the machining head is connected,
wherein the control unit, in a case of the laser machining apparatus judging that the beam combiner is a failure location, controls the switch to switch the laser oscillator to which the machining head is connected, and performs backup operation.

12. The laser machining apparatus according to claim 6, further comprising a plurality of the laser oscillators;
a switch which switches between the oscillator to which the machining head is connected,
wherein the control unit, in a case of the laser machining apparatus judging that the beam combiner is a failure location, controls the switch to switch the laser oscillator to which the machining head is connected, and performs backup operation.

13. A control method for a laser machining apparatus wherein a machining head is connected to a laser oscillator which includes:
a plurality of current control units connected mutually in parallel to a power supply and controlling current outputted from the power supply;
a plurality of laser diode modules which are connected one-to-one to the plurality of current control units, and output light by the current controlled by the current control units flowing therethrough;
a plurality of laser cavities which connect one-to-several to the plurality of laser diode modules, and amplify and then output light outputted by the laser diode modules; and
a beam combiner which connects one-to-several to the plurality of laser cavities, and combines light outputted by the plurality of laser cavities,
wherein the laser machining apparatus is configured to perform machining by outputting the light combined by the beam combiner under control of a control unit from the machining head, the control method comprising:
a current monitoring step of monitoring each value of current controlled by the plurality of current control units;
a power monitoring step of monitoring each value of intensity of light outputted by the plurality of laser diode modules, each value of intensity of light outputted by the plurality of laser cavities, and value of intensity of light outputted by the beam combiner, and
a judgment step of judging a failure location based on values of current monitored in the current monitoring step, and values of intensity of light monitored in the power monitoring step,
the failure location is judged to be in the plurality of current control units if any value of current controlled by the plurality of current control units is 0 A,
the failure location is judged to be in the plurality of laser diode modules if the failure location is not judged to be in the plurality of current control units and any value of intensity of light outputted by the plurality of laser diode modules is 0 kW,
the failure location is judged to be in the plurality of laser cavities if the failure location is not judged to be in the plurality of current control units or the plurality of laser diode modules and any value of intensity of light outputted by the plurality of laser cavities is 0 kW,
the failure location is judged to be at the beam combiner if the failure location is not judged to be in the plurality of current control units, the plurality of laser diode modules, or the plurality of laser cavities, and the value of intensity of light outputted by the beam combiner is 0 kW.

14. The control method according to claim 13, wherein the control unit, if any of the plurality of current control units and the plurality of laser diode modules is judged as being a failure location in the judgment step, increases current outputted to the current control unit which does not include a failure location on a path, so as to set an intensity of light outputted by the machining head as the same as prior to failure.

15. The control method according to claim 13, wherein the control unit, if any of the plurality of laser cavities is judged as being a failure location in the judgment step, suspends current outputted to the current control unit which includes a failure location on a path, and increases current outputted to the current control unit which does not include a failure location on the path, so as to set an intensity of light outputted by the machining head as equal to prior to failure, or when not able to set as equal, makes approach equal.

16. The control method according to claim 15, wherein the control unit performs backup operation with reduced machining speed, when not able to set the intensity of light outputted by the machining head as equal to prior to failure.

17. A control method for a laser machining apparatus wherein a machining head is connected to a laser oscillator which includes:
a plurality of current control units connected mutually in parallel to a power supply and controlling current outputted from the power supply;
a plurality of laser diode modules which are connected one-to-one to the plurality of current control units, and output light by the current controlled by the current control units flowing therethrough;
a plurality of laser cavities which connect one-to-several to the plurality of laser diode modules, and amplify and then output light outputted by the laser diode modules; and
a beam combiner which connects one-to-several to the plurality of laser cavities, and combines light outputted by the plurality of laser cavities,
wherein the laser machining apparatus is configured to perform machining by outputting the light combined by the beam combiner under control of a control unit from the machining head,
wherein the laser machining apparatus further comprising a plurality of the laser oscillators; and
a switch which switches between the oscillator to which the machining head is connected,
the control method comprising:
a current monitoring step of monitoring each value of current controlled by the plurality of current control units;
a power monitoring step of monitoring each value of intensity of light outputted by the plurality of laser diode modules, each value of intensity of light outputted by the plurality of laser cavities, and value of intensity of light outputted by the beam combiner, and
a judgment step of judging a failure location based on values of current monitored in the current monitoring step, and values of intensity of light monitored in the power monitoring step,
wherein the control unit, if the beam combiner is judged as being a failure location in the judgment step, controls the switch to switch the laser oscillator to which the machining head is connected, and performs backup operation, and the failure location is judged to be in the plurality of current control units if any value of current controlled by the plurality of current control units is 0 A, the failure location is judged to be in the plurality of laser diode modules if the failure location is not judged to be in the plurality of current control units and any value of intensity of light outputted by the plurality of laser diode modules is 0 kW, the failure location is judged to be in the plurality of laser cavities if the failure location is not judged to be in the plurality of current control units or the plurality of laser diode modules and any value of intensity of light outputted by the plurality of laser cavities is 0 kW, and the failure location is judged to be at the beam combiner if the failure location is not judged to be in the plurality of current control units, the plurality of laser diode modules, or the plurality of laser cavities, and the value of intensity of light outputted by the beam combiner is 0 kW.

\* \* \* \* \*